United States Patent [19]
Agahi-Kesheh et al.

[11] Patent Number: 5,192,924
[45] Date of Patent: Mar. 9, 1993

[54] FILTER CIRCUIT FOR ATTENUATING HIGH FREQUENCY SIGNALS

[75] Inventors: Darioush Agahi-Kesheh, Buffalo Grove; Duane C. Rabe, Rolling Meadows, both of Ill.

[73] Assignee: Motorola, Inc., Schaumburg, Ill.

[21] Appl. No.: 786,225

[22] Filed: Oct. 31, 1991

[51] Int. Cl.⁵ .................. H03H 7/00; H01P 1/20
[52] U.S. Cl. ...................... 333/175; 333/204; 333/202
[58] Field of Search ............ 333/204, 175, 176, 202, 333/168

[56] References Cited

U.S. PATENT DOCUMENTS

4,423,396 12/1983 Makimoto et al. ............. 333/204
4,513,263 4/1985 Minnis .......................... 333/204

Primary Examiner—Robert J. Pascal
Assistant Examiner—Ali Neyzari
Attorney, Agent, or Firm—Robert H. Kelly

[57] ABSTRACT

A low pass filter circuit for a radiotelephone which filters harmonic, spectral components of a modulated signal generated by the radiotelephone. The filter circuit is comprised of inductors and capacitors wherein each inductor and each capacitor of the filter is comprised of a distributed-element portion and a discrete-element portion. The distributed element portions of each inductor and each capacitor of the filter attenuate higher-frequency, spectral components of a signal applied thereto. The discrete element components of each inductor and each capacitor of the filter attenuate lower-frequency, spectral components of the signal applied thereto.

13 Claims, 5 Drawing Sheets

FILTER CIRCUIT FOR ATTENUATING HIGH FREQUENCY SIGNALS

BACKGROUND OF THE INVENTION

The present invention relates generally to filter circuit constructions, and, more particularly, to a low-pass filter circuit for filtering high-frequency harmonic components of a radio-frequency signal generated by a transmitter.

A communication system is operative to transmit information (referred to hereinbelow as an "information signal") between two or more locations, and includes a transmitter and a receiver interconnected by a transmission channel. Information is transmitted by the transmitter to the receiver upon the transmission channel. A radio communication system is a communication system in which the transmission channel comprises a radio-frequency channel wherein the radio-frequency channel is defined by a range of frequencies of the electromagnetic spectrum.

The transmitter forming a portion of a radio communication system includes circuitry for converting the information signal which is to be transmitted into a form suitable for transmission thereof upon the radio-frequency channel. Such circuitry is referred to as modulation circuitry which performs a process referred to as modulation. In such a process, the information signal is impressed upon a radio-frequency electromagnetic wave. The radio-frequency electromagnetic wave is of a frequency within the range of frequencies defining the radio-frequency channel upon which the information signal is to be transmitted. The radio-frequency electromagnetic wave is commonly referred to as "the carrier signal," and the radio-frequency electromagnetic wave, once modulated by the information signal, is commonly referred to as the modulated signal.

Various modulation schemes are known for impressing the information signal upon the carrier signal to form the modulated signal. For instance, amplitude modulation, frequency modulation, and phase modulation are all modulation schemes by which an information signal may be impressed upon a carrier wave to form a modulated signal.

Radio communication systems are advantageous in that no physical interconnection is required between the transmitter and the receiver; once the information signal is modulated to form the modulated signal, the modulated signal may be transmitted over large distances.

A cellular, communication system is one type of radio communication system. Radio transceivers (conventionally referred to as radiotelephones) operative in such a cellular, communication system contain circuitry permitting simultaneous generation and reception of modulated signals to permit thereby two-way communication between a radiotelephone and remotely-located transceivers. The remotely-located transceivers, referred to as "base stations," are physically connected to a conventional telephonic network to permit communication between a radiotelephone and a fixed location of the conventional telephonic network. A cellular, communication system is formed by positioning numerous base stations at spaced-apart locations throughout a geographical area. Each base station contains circuitry to receive modulated signals transmitted thereto by one, or many, radiotelephones, and to transmit moduclated signals to the one, or many, radiotelephones.

A frequency band of the electromagnetic frequency spectrum (in the United States extending between 800 MHz and 900 MHz) is allocated for radiotelephone communication upon a cellular, communication system. The allocated frequency band is further divided into a plurality of transmission channels of defined bandwidths. Modulated signals generated by radiotelephones are transmitted upon selected ones of the transmission channels defined upon the frequency band allocated for radiotelephone communications. Similarly, modulated signals generated by the base stations are also transmitted upon selected ones of the transmission channels defined upon such frequency band.

As a byproduct of the modulation process to form the modulated signal, harmonics of the desired signal are also generated. These harmonics are essentially duplicates of the desired signal, but are of frequencies which are multiples of the desired signal. As a result, the modulated signal actually generated is comprised of spectral components of not only the desired frequencies, but also of frequencies which are multiples of the desired signal.

By way of an example, a radiotelephone operative to generate a modulated signal for transmission upon a transmission channel defined within the frequency band allocated for such communication generates a modulated signal wiich is comprised not only of spectral components forming the desired signal (of frequencies corresponding to the frequencies defining the transmission channel) but also of spectral components of harmonics of the desired signal. The spectral components of the harmonics may be of frequencies up to, and in excess of, 10 gigahertz.

Transmission of such spectral components can, of course, interfere with modulated signals transmitted at other higher frequencies.

Accordingly, radiotelephones typically include filter circuitry to attempt to attenuate transmission of all but the desired spectral components of the modulated signal.

Ceramic block filters, containing distributed circuit elements, oftentimes form the filter circuitry to attempt to attenuate transmission of all such spectral components of the modulated signal but the desired spectral components. However, due to the construction of such ceramic block filters, spectral components of the modulated signal applied thereto of frequencies corresponding to odd harmonics of frequencies of the pass bands of such ceramic block filters (such pass bands correspond, of course, to the range of frequencies comprising the spectral components of the desired signal) are not attenuated.

To attempt to prevent transmission of such odd-harmonics of the modulated signal, therefore, transmitter circuitry of such radiotelephones frequently further include low pass filters cascaded with the ceramic block filters. The low pass filters are utilized to attempt to attenuate all spectral components of the modulated signal beyond the cut off frequencies of such low pass filters.

In many instances, the low pass filters are constructed of lumped elements—i.e., discrete elements. Such lumped-element, low pass filters are useful in the attenuation of spectral components of a modulated signal applied thereto of frequencies up to several gigahertz (GHz). However, parasitic effects associated with the discrete elements of such lumped-element, low pass filters limit the usefulness of such filters to attenuate spectral components of frequencies in excess of several gigahertz. In fact, at higher frequencies, such parasitic effects result in such deteriorated performance of the low pass filters that little, or no, attenuation of the higher-frequency spectral components of the modulated signal applied thereto occurs.

Low pass filters comprised of distributed elements, i.e., elements comprised of transmission lines, are similarly also oftentimes utilized to form portions of transmitter circuitry of a radiotelephone. Such constructions of low pass filters (as contrasted to lumped-element, low pass filters) effectively attenuate the higher-frequency spectral components of a modulated signal applied thereto. However, the physical dimensions of the transmission lines forming the elements of such low pass filter construction become increasingly significant as the cut off frequency required of the low pass filter is reduced. That is to say, the physical dimensions required of the transmission lines forming the distributed elements of such low pass filters is significantly greater when the cut off frequency required of the low pass filter is reduced in frequency, for example by reducing the cut off frequency to one GHz from four GHz, the physical dimensions required of such a filter is significantly reduced. Additionally, such filters comprised of distributed elements do not effectively attenuate high frequencies. However, when the inductive and capacitive values of the components of such filters are of large enough values, the frequencies not attenuated are of such significant values to pose little problem.

As size minimization is a critical design goal in the design of portable radiotelephones (as well as other radiotelephone constructions), a low pass filter circuit constructed only of distributed elements and operative to attenuate all of the undesired spectral components of the modulated signal is unduly large.

As the portable radiotelephones (and also, radiotelephones of other constructions) are packaged in increasingly miniaturized housings, the circuitry of such radiotelephones must similarly be of reduced dimensions. The significant dimensional requirements required of a distributed-element, low pass filter as the cut off frequency of the filter is reduced can become a serious design constraint.

It is further noted that, to minimize the area required to form circuitry comprised of such distributed elements upon a surface of a circuit board (a distributed element printed upon the surface of a circuit board is referred to as a microstrip), such distributed elements may be disposed beneath the surface of the circuit board, and, for example, form a middle layer of a three-layer circuit board (a distributed element disposed beneath the surface of a circuit board is referred to as stripline).

Distributed elements forming microstrips printed upon the surface of a circuit board must be shielded to prevent electromagnetic emanations generated thereat from interfering with other circuitry of the radiotelephone. Distributed elements forming striplines disposed beneath the surface of the circuit, while not required to be shielded, can not be tuned once formed.

To attenuate all but the desired spectral components of a modulated signal generated by the transmitter circuitry of several radiotelephone constructions, in addition to the aforementioned ceramic block filters, two, or more, low pass filters are cascaded in a series arrangement. A first low pass filter comprised of lumped elements is utilized to cause attenuation of a first, and low-frequency, group of spectral components of a modulated signal applied thereto. And, a second low pass filter, comprised of distributed elements, is utilized to attenuate spectral components of a modulated signal applied thereto of a second, and higher-frequency, group of spectral components. While such a cascaded arrangement of filters attenuates the non-desired spectral components of the modulated signal, such cascaded arrangement causes additional insertion loss of the transmitted signal, as well as increased dimensional requirements due to the construction of two separate filter circuits.

What is needed, therefore, is a low pass filter construction which attenuates all spectral component portions of a modulated signal, except for desired spectral component portions of the modulated signal, but which also minimizes the dimensional requirements of the filter construction.

SUMMARY OF THE INVENTION

The present invention, accordingly, advantageously provides a low pass filter construction of minimal dimensions operative to attenuate spectral component portions of a signal applied thereto in excess of the cut off frequency of the filter.

The present invention further advantageously provides a filter circuit for a radiotelephone for attenuating harmonic components of a modulated signal generated by the radiotelephone of frequencies greater than the cut off frequency of the filter circuit.

The present invention yet further advantageously provides a radiotelephone operative to generate a modulated signal in which undesired harmonic, spectral components of the desired, modulated signal are attenuated.

The present invention includes further advantages and features, the details of which will become more apparent by reading the detailed description of the preferred embodiments hereinbelow.

In the accordance with the present invention, therefore, a filter circuit for attenuating selected frequency component portions of a signal applied thereto is disclosed. The filter circuit comprises an L-C circuit having at least one inductor and at least one capacitor. The at least one inductor is formed of first and second portions. The first portion of the at least one inductor is comprised of a discrete inductive component, and the second portion of the at least one inductor is comprised of a distributed inductive component. The at least one capacitor is formed of first and second poritons. The first portion of the at least one capacitor is comprised of a discrete capacitive component, and the second portion of the at least one capacitor is comprised of a distributed capacitive component.

BRIEF DESCRIPTION OF THE DRAWINGS

The present invention will be better understood when read in light of the accompanying drawings in which.

DESCRIPTION OF THE PREFERRED EMBODIMENTS

Figure 1:
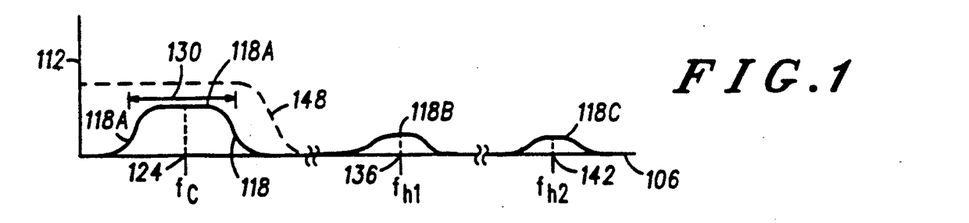
FIG. 1 is a graphical representation of a modulated signal generated by a transmitter, such as the transmitter circuitry of a radiotelephone, plotted as a function of frequency.

Referring first to the graphical representation of FIG. 1, a modulated signal generated by a transmitter, such as transmitter circuitry forming a portion of a radiotelephone or other such radio transceiver, is shown. Abscissa axis 106 is scaled in terms of frequency, such as megahertz, and ordinate axis 112 is scaled in terms of magnitude, such as milliwatts (mW), or decibels (dB), or dBm.

Waveform 118 is plotted upon the axis system defined by axes 106–112, and is representative of a typical, modulated signal generated by such a transmitter in the absence of, or with inadequate, filtering of undersired, harmonic, spectral components of the modulated signal generated by the transmitter.

As mentioned previously, a modulated signal is formed by impressing an information signal upon a carrier signal. Waveform 118, representative of such a modulated signal, is formed by impressing an information signal upon a carrier signal having a center frequency, $f_c$, denoted by reference numeral 124. The information content is contained within a band of frequencies centered at, or close to, the center frequency 124 of the modulated signal. Such range of frequencies is referred to as the modulation spectrum, and is designated in FIG. 1 by waveform portion 118A which is encompassed by arrow 130.

During modulation of the information signal to form the modulated signal, harmonics of the desired signal (designated by waveform portion 118A), having spectral components which are multiples of the frequencies of the spectral components of the desired signal, are also generated. Such harmonics are represented in the figure by waveform portions 118B and 118C of waveform 118. The harmonic represented by waveform portion 118B is formed of spectral components having a center frequency, $f_{h1}$, denoted by reference numeral 136, and the harmonic represented by waveform portion 118C is comprised of spectral components having a center frequency, $f_{h2}$, of a frequency denoted by reference numeral 142.

While not shown in the graphical representation of FIG. 1, additional harmonics comprised of spectral components of greater multiples of the center frequency 124, are also generated during modulation of an information signal upon a carrier signal.

As generation of such harmonics can interfere with other modulated signals having frequencies corresponding to the frequencies of the spectral components of the harmonics (as represented in FIG. 1 by waveform portions 118B and 118C), filtering of the harmonics to prevent their transmission, and possible, subsequent interference with other modulated signals is desired.

Curve 148, shown in hatch, represents the filter characteristics of a low pass filter. The low pass filter is operative to attenuate the spectral components of a modulated signal applied thereto having frequencies in excess of the cut off frequency of the low pass filter, and, the low pass filter has a cut off frequency which is greater than the maximum frequency of the modulation spectrum comprising waveform portion 118A.

Figure 2:
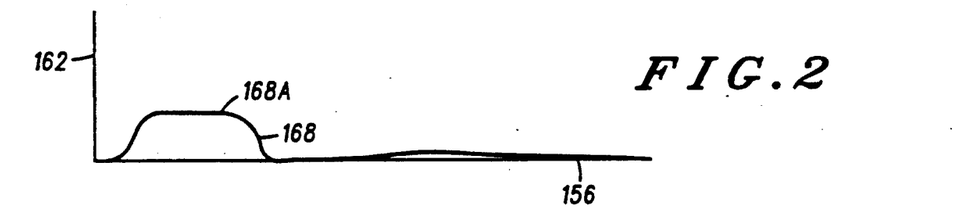
FIG. 2 is a graphical representation, similar to that of FIG. 1, not illustrating a modulated signal generated by a transmitter wherein harmonic, spectral components of the modulated signal have been attenuated by low pass filter circuitry.

FIG. 2 is a graphical representation of a modulated signal which does not have harmonic, spectral components forming a portion of the signal. Such a signal is ideally transmitted by a transmitter, such as the transmitter portion of a radiotelephone or other radio transceiver. Similar to abscissa and ordinate axes 106 and 112 of FIG. 1, axes 156 and 162 are scaled in terms of frequency and magnitude, respectively. Waveform 168 comprises only waveform portion 168A. Waveform 168 is representative of a modulated signal after application to a low pass filter having filter characteristics similar to the filter characteristics represented by curve 148 of FIG. 1. The information content of the modulated signal is contained within waveform portion 168A, and harmonics of the desired, modulated signal are attenuated, and do not form a portion of the modulated signal transmitted by the transmitter. As the harmonics are attenuated and are not transmitted, the modulated signal transmitted by the transmitter does not interfere with other modulated signals generated at the frequencies of the harmonics. As mentioned hereinabove, however, existing low pass filter circuitry either inadequately filters the higher frequency harmonics, or is of large physical dimensions.

Figure 3:
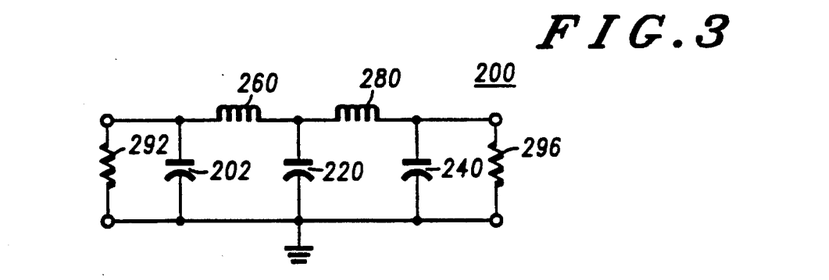
FIG. 3 is a circuit diagram of a five-pole filter forming a low pass filter of a preferred embodiment of the present invention.

Turning now to the circuit diagram of FIG. 3, an L-C circuit, referred to generally by reference numeral 200, is shown. Circuit 200 forms a five-pole, low pass filter which may be constructed according to the teachings of the present invention. While the following descriptions of the preferred embodiments of the present invention describe five-pole, low pass filters, it is to be understood that the teachings of the present invention may be similarly utilized to form a filter of many other designs.

Circuit 200 forming the five-pole filter is comprised of three capacitors 202, 220, and 240, each having first sides thereof commonly connected to a ground potential. Second sides of capacitors 202 and 220 are connected through inductor 260, and second sides of capacitors 220 and 240 are connected through inductor 280. Impedance elements 292 and 296 are further illustrated in the circuit diagram and are representative of input and termination impedances, respectively. As is known, the capacitive values of capacitors 202-240 and inductive values of inductors 260-280 are selected responsive to the values of the input and termination impedances and the desired cut off frequency of the filter 200 formed of the L-C combination.

As mentioned previously, the circuit elements comprising a filter circuit such as circuit 200 may be comprised of lumped, i.e., discrete, elements. However, the filter characteristics of a low pass filter comprised of such elements inadequately attenuates spectral components of frequencies in excess of several GHz of a signal applied to such a filter.

Figure 4:
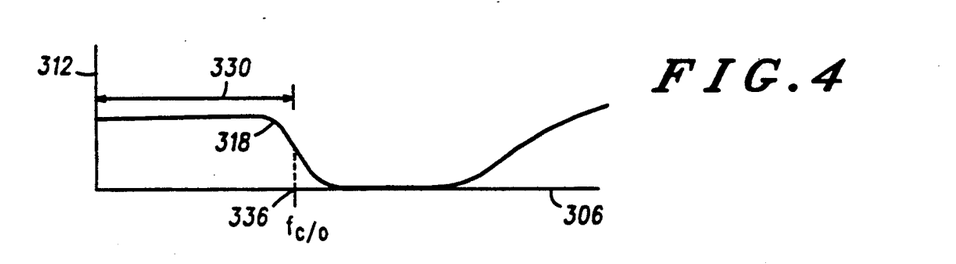
FIG. 4 is a graphical representation illustrating the filter characteristics of a low pass filter comprised of lumped elements plotted as a function of frequency.

FIG. 4 is a graphical representation of the filter characteristics of a low pass filter such as circuit 200 of FIG. 3 when the circuit elements forming the filter are comprised of lumped elements. Abscissa axis 306 is scaled in terms of frequency, here megahertz, and ordinate axis 312 is scaled in terms of magnitude, such as milliwatts (mW) or decibels (dB or dBm). Curve 318 represents the filter characteristics of the low pass filter when comprised of lumped elements. The desired pass band of the low pass filter comprises a range of frequencies defined by the range of frequencies encompassed by line segment 330 and a cut off frequency of a frequency designated by reference numeral 336. In a radiotelephone operative to transmit modulated signals in a cellular, communication system in the United States, the cut off frequency of a low pass filter forming a portion of the transmitter circuitry of such a radiotelephone may, for example, be of a frequency of a value of approximately one GHz.

An ideal low pass filter attenuates spectral components of a signal applied thereto which are of frequencies in excess of the cut off frequency of the filter. However, and as noted previously, when the low pass filter circuit is comprised of lumped elements, attenuation of high-frequency, spectral components of a signal applied thereto is inadequate. The right-hand side portion of curve 318 indicates that very little attenuation of high-frequency, spectral components of a signal applied to such a filter occurs. In fact, at very high frequencies, such a low pass filter is almost wholly inoperative as a low pass filter.

As also mentioned previously, a low pass filter circuit, such as circuit 200 of FIG. 3, may, alternately, also be comprised of distributed elements. While a low pass filter circuit comprised of such distributed elements adequately attenuates higher-frequency spectral components of a signal applied thereto, the physical dimensions required of a low pass filter circuit comprised of distributed elements when the cut off frequency of a filter formed thereby is required to be of a relatively low value, such as the one GHz cut off frequency of a low pass filter utilized by a radiotelephone operative in a cellular, communication system becomes large.

Figure 5:
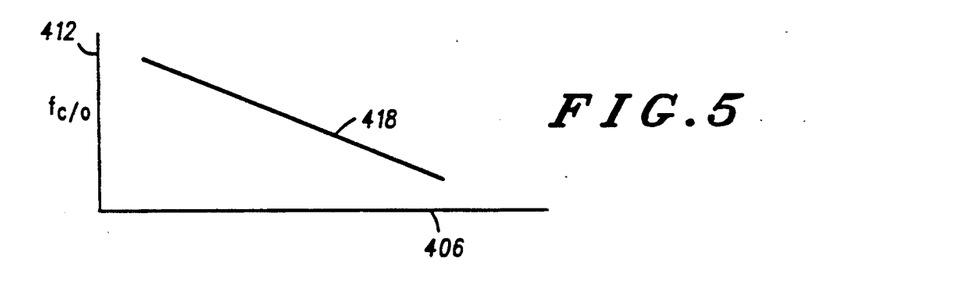
FIG. 5 is a graphical representation illustrating the relationship between the cut off frequency of a low pass filter comprised of distributed elements and the lengths required of the component elements comprising the filter having the corresponding cut off frequencies.

FIG. 5 is a graphical representation of the relationship between the length required of a low pass filter circuit comprised of distirbuted elements and the cut off frequency of the low pass filter formed thereby. Abscissa axis 406 is scaled in terms of length dimensions, such as millimeters, and ordinate axis 412 is scaled in terms of frequency, such as gigahertz. Curve 418 is a plot of the relationship between the length required of transmission lines comprising the distributed elements of such a low pass filter required of a filter cut off frequencies of different values. As the cut off frequency of the filter decreases, the length required of the transmission lines comprising the filter increases. As size minimization is a critical design goal in the design of portable radiotelephones, a low pass filter circuit constructed only of distributed elements, and having a cut off frequency of a frequency corresponding to the cut off frequency of a low pass filter forming a portion of a radiotelephone operative to transmit signals in a cellular, communication system is unduly large.

Figure 6:
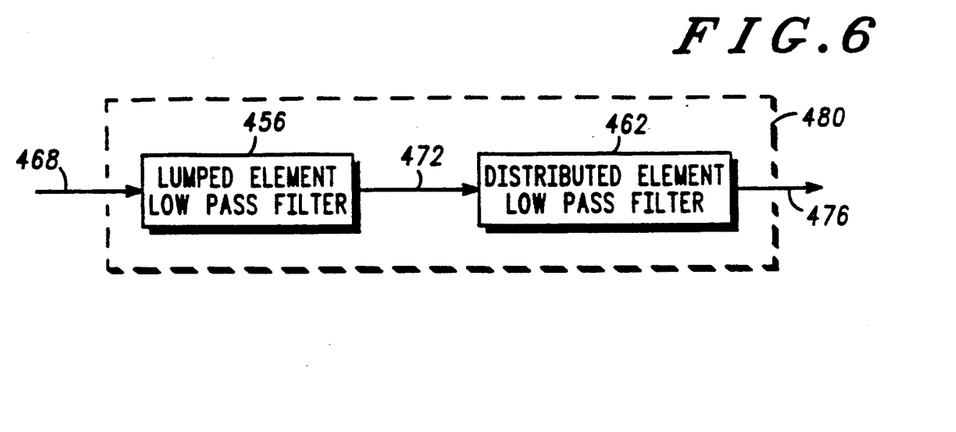
FIG. 6 is a block diagram of a cascaded arrangement of low pass filters, a first of which is comprised of lumped elements, and a second of which is comprised of distributed elements.

FIG. 6 is a block diagram of a cascaded arrangement of two low pass filters. A first low pass filter, designated by block 456 is a low pass filter comprised of lumped elements. A second low pass filter, designated by block 462, is comprised of distributed elements. Each filter, designated by reference numerals 456 and 462, respectively, may, for example, may be a five-pole, low pass filter such as circuit 200 of FIG. 3. The filter comprised of the lumped elements is advantageously constructed to be of a cut off frequency of a low value, such as the one GHz cut off frequency mentioned hereinabove. The filter comprised of the distributed elements is advantageously constructed to have a cut off frequency of a value significantly larger than the one GHz cut off frequency mentioned hereinabove, thereby limiting the dimensional requirements of the filter circuit.

A signal applied on line 468 to filter 456 attenuates spectral components of the signal which are greater than the cut off frequency of the filter. However, due to the filter characteristics of a low pass filter comprised of lumped elements (as described previously with respect to FIG. 4), higher-frequency, spectral components of the signal applied to filter 456 on line 468 are not attenuated by the filter, but are passed on line 472.

The signal generated by filter 456 on line 472 is applied to filter 462. Filter 462 is constructed to have a cut off frequency greater than the cut off frequency of filter 456, as filter 456 adequately attenuates lower-frequency, spectral components beyond the cut off frequency of filter 456. Filter 462 is operative to attenuate the higher-frequency, spectral components of the signal applied on line 468 which are inadequately attenuated by filter 456.

The signal generated by filter 462 on line 476 is one in which the undersired, spectral components above the cut off frequencies of both filters 456 and 462 are attenuated.

However, such a cascaded arrangement requires two separate filter circuits resulting in increased physical dimensional requirements as well as insertion loss associated with each filter. Therefore, a cascaded arrangement of two separate filter circuits is a far from ideal solution for attenuating harmonic, spectral componets of a modulated signal generated by transmitter circuitry of a radiotelephone.

Block 480, shown in hatch, represents the filter of a preferred embodiment of the present invention. A signal applied to the filter on line 468 is filtered, and a filtered signal is generated on line 476. Rather than cascading two filters, the filter of the preferred embodiment forms a single filter, but the component elements forming the filter are comprised of both discrete-element portions and distributed-element portions. Additionally, the values of the capacitive and inductive components forming the filter are great enough such that frequencies of the odd harmonics, which are not attenuated, are of such significant values that the failure to attenuate such harmonics pose little problem.

Figure 7A:
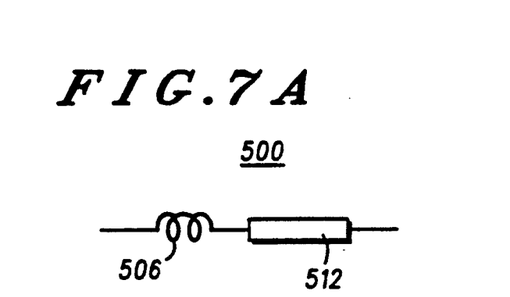
FIG. 7A is a circuit schematic of an inductor comprised of both a lumped-element portion, and a distributed-element portion.

FIG. 7A is a partial circuit, partial block diagram of an inductor, referred to generally by reference numeral 500, constructed according to the teachings of the present invention. Inductor 500 is comprised of two portions, a first portion of which, indicated by reference numeral 506, is comprised of a discrete, inductive component (i.e., a coil) and a second portion, designated by reference numeral 512, is comprised of a distributed element (i.e., a transmission line).

Figure 7B:
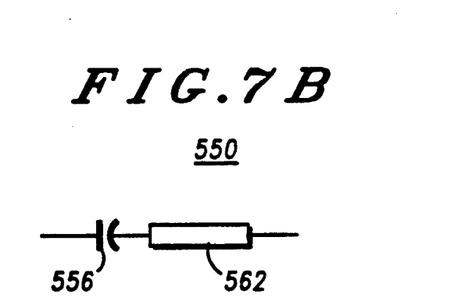
FIG. 7B is a circuit schematic of a capacitor comprised of both a lumped-element portion and a distributed-element portion.

FIG. 7B is a partial circuit, partial schematic diagram of a capacitor, referred to generally by reference numeral 550 constructed according to the teachings of the present invention. Capacitor 550 is comprised of two portions, a first portion of which, designated by reference numeral 556, is comprised of a discrete capacitor, and a second portion of which, designated by reference numeral 562 is comprised of a distributed element (i.e., a transmission line).

Inductors and capacitors similar to inductor 500 and capacitor 550 in FIGS. 7A and 7B, respectively, may be utilized to form a filter circuit, such as circuit 200 of FIG. 3. Utilization of lumped elements, designated by reference numerals 506 and 556 of inductor 500 and capacitor 550 of FIGS. 7A and 7B permits a low pass filter constructed therefrom to have a cut off frequency of a relatively low value (such as the one GHz value mentioned hereinabove). Analogously, utilization of distributed elements, designated by reference numerals 512 and 562 of inductor 500 and capacitor 550 of FIGS. 7A and 7B permits a low pass filter constructed therefrom to attenuate adequately high-frequency, spectral components of a signal applied thereto. Because only a single filter circuit is required to be constructed to attenuate adequately the undesired spectral components of a signal applied thereto, problems associated with cascading two separate filter circuits theretogether are avoided.

Figure 8:
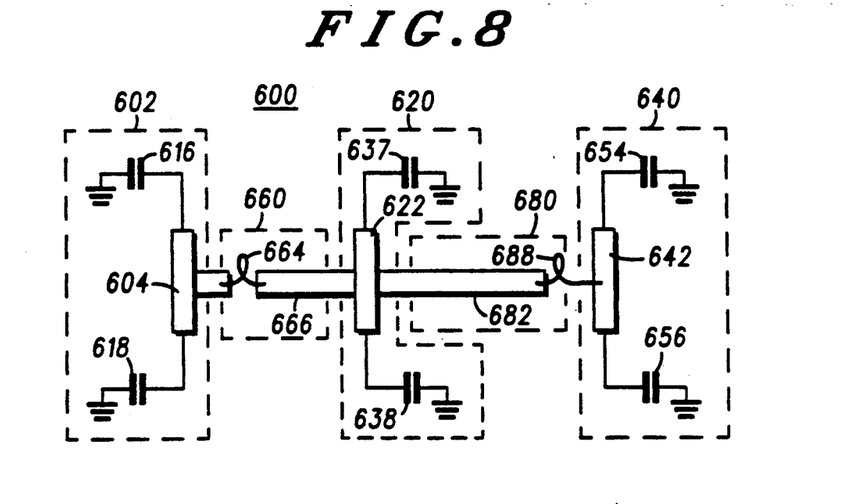
FIG. 8 is a partial circuit, partial schematic diagram of a five-pole filter, similar to that presented in the circuit diagram of FIG. 3, of a preferred embodiment of the present invention.

FIG. 8 is a partial circuit, partial schematic diagram of a five-pole, low pass filter circuit, referred to generally by reference numeral 600, of a preferred embodiment of the present invention. Similar to circuit 200 shown in the circuit diagram of FIG. 3, circuit 600 is comprised of three capacitors and two inductors.

A first capacitor, designated by block 602, shown in hatch, is comprised of both a discrete capacitive component and a distributed capacitive component. Accordingly, capacitor 602 is comprised of transmission line 604 which is coupled at opposing end portions thereof to discrete capacitors 616 and 618.

Similarly, a second capacitor, designated by block 620, shown in hatch, is comprised of a discrete capacitive component and a distributed capacitive component. Accordingly, capacitor 620 is comprised of transmission line 622 which is coupled at opposing end portions thereof to discrete capacitors 637 and 638.

Also, a third capacitor, designated by block 640, shown in hatch, is comprised of a discrete capacitive component and a distributed capacitive component. Accordingly, capacitor 640 is comprised of transmission line 642 which is coupled at opposing end portions thereof to discrete capacitors 654 and 656.

Capacitors 602, 620, and 640 are all commonly connected at first ends thereof to a common ground potential. Capacitors 602 and 620 are interconnected at second ends thereof to inductor 660, shown in hatch. Inductor 660 is comprised of a discrete inductive component and a distributed inductive component. Accordingly, inductor 660 is comprised of coil 664 and transmission line 666.

Similarly, inductor 680 interconnects second sides of capacitors 620 and 640. Inductor 680, designated by a block, shown in hatch, is also comprised of a discrete inductive component and a distributed inductive component. Accordingly, inductor 680 is comprised of transmission line 682 and coil 688.

Because the discrete capacitive and inductive component portions of the components of filter circuit 600 are operative to attenuate lower-frequency spectral components of a signal applied thereto, physical dimensions of the filter circuit are minimized. Also, because of the distributed component portions of the components comprising filter circuit 600 adequately attenuate the higher-frequency, spectral components of a signal applied to the filter, all but the desired spectral components of a signal applied to filter circuit 600 are adequately attenuated.

Figure 9:
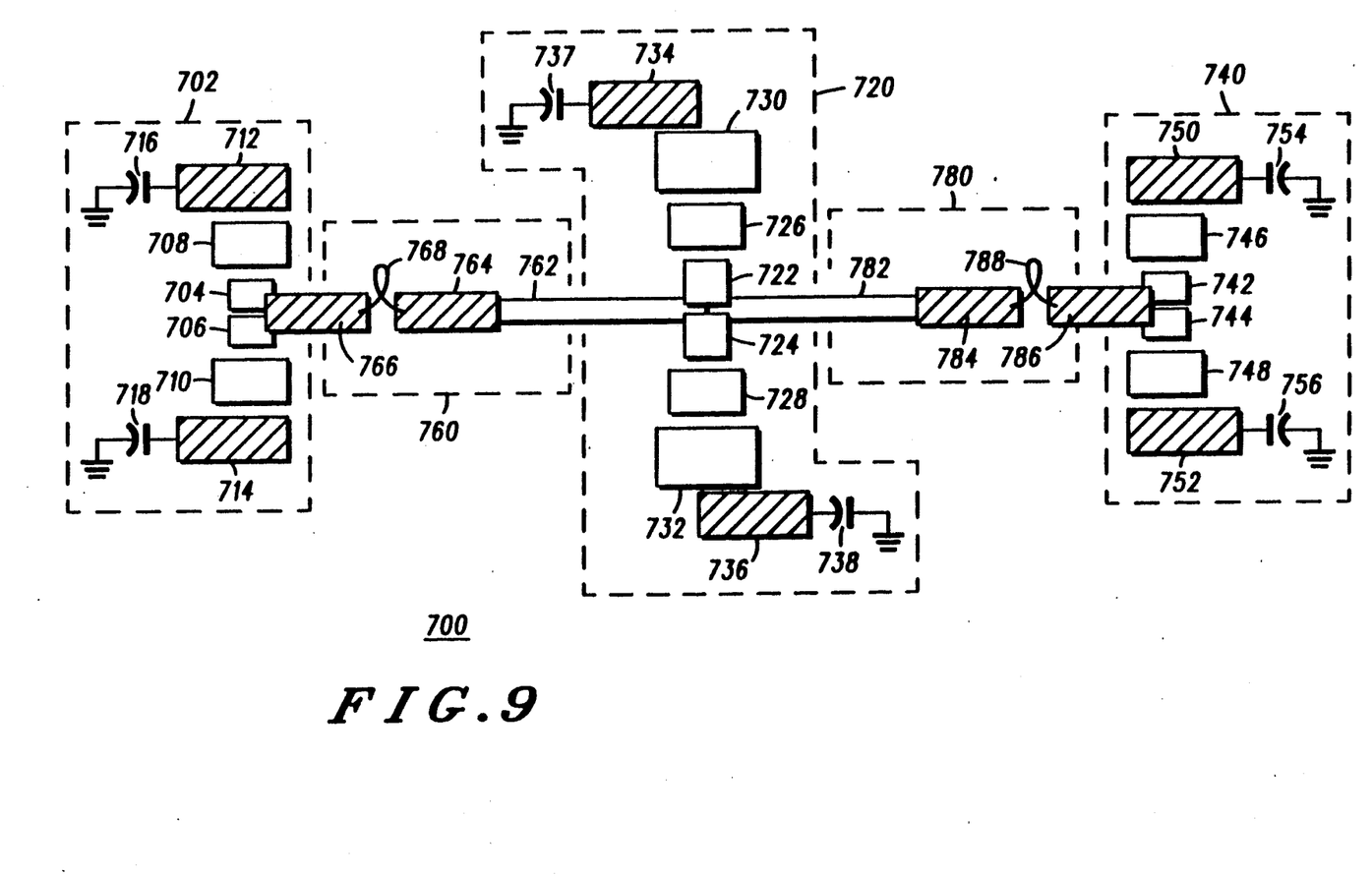
FIG. 9 is a partial circuit, partial schematic diagram of a five-pole filter, similar to that of FIG. 8, but of an alternate preferred embodiment of the present invention.

Turning now to the partial circuit, partial schematic diagram of FIG. 9, there is shown another five-pole, low pass filter circuit, referred to generally by reference numeral 700 of an alternate, preferred embodiment of the present invention. The distributed elements comprising portions of each circuit component element of circuit 700 are formed, in part, of strip lines, disposed beneath a surface of a circuit board. As mentioned previously, when transmission lines forming distributed elements are comprised of strip lines rather than microstrips, additional shielding apparatus for preventing emanation of radio-frequency waves which might interfere with other circuitry is not required.

Again, the five-pole, low pass filter circuit comprising circuit 700 is comprised of three capacitors and two inductors. Each capacitor and each inductor of circuit 700 is comprised of both distributed element components and discrete element components. It is noted that distributed element components of circuit 700 which form microstrips are indicated by blocks shown in cross hatching, and distributed element component portions forming strip lines are indicated by blocks not including cross hatching.

A first capacitor, designated by block 702, shown in hatch, is comprised of a discrete capacitive component and a distributed capacitive component. Accordingly, capacitor 702 is comprised of strip lines 704, 706, 708, and 710, and microstrips 712 and 714. Microstrips 712 and 714 are electrically coupled to strip lines 708 and 710 by way of vias extending through a circuit board between the strip lines and associated microstrips. Discrete capacitors 716 and 718 each have first ends thereof electrically coupled to microstrips 712 and 714, respectively. Second sides of capacitors 716 and 178 are coupled to electrical ground.

A second capacitor, designated by block 720, shown in hatch, is comprised of a discrete capacitive component and a distributed capacitive component. Accordingly, capacitor 720 is comprised of microstrip lines 722, 724, 726, 728, 730, and 732, and microstrips 734 and 736. Microstrips 734 and 736 are electrically coupled to strip lines 730 and 732, respectively, by way of vias extending through a circuit board between the strip lines and the associated microstrips. Discrete capacitors 737 and 738 each have first sides thereof electrically coupled to microstrips 734 and 736, respectively. Second sides of capacitors 737 and 738 are electrically coupled to ground.

A third capacitor, designated by block 740, shown in hatch, is comprised of a discrete capacitive component and a distributed capacitive component. Accordingly, capacitor 740 is comprised of strip lines 742, 744, 746, and 748, and microstrips 750 and 752. Microstrips 750 and 752 are electrically coupled to strip lines 746 and 748 by way of vias extending through a circuit board between the strip lines and the associated microstrips. Discrete capacitors 754 and 756 each have first sides thereof electrically coupled to microstrips 750 and 752, respectively. Second sides of capacitors 754 and 756 are electrically coupled to ground.

A first inductor, designated by block 760, shown in hatch, is comprised of a discrete inductive component and a distributed inductive component. Accordingly, inductor 760 is comprised of strip line 762 and microstrips 764 and 766. Strip line 762 is electrically coupled to microstrip 764 by way of a via extending through a circuit board between the strip line and the microstrip. Coil 768 is electrically connected to microstrips 764 and 766.

A second inductor, designated by block 780, shown in hatch, is comprised of a discrete inductive component and a distributed inductive component. Accordingly, inductor 780 is comprised of strip line 782 and microstrips 784 and 786. Strip line 782 is electrically coupled to microstrip 784 by way of a via extending through a circuit board between the strip line and the microstrip. Coil 788 is electrically coupled at opposing sides thereof to microstrips 784 and 786.

The lengths of strip lines 762 and 782 of inductors 760 and 780, respectively, control the amount of intercoupling between the distributed elements comprising capacitors 706 and 720 and capacitors 720 and 740, respectively.

It is noted that strip lines forming the distributed elements are formed of generally rectangular transmission line segments as the characteristics of such segments may be easily modelled. Other combinations of transmission line segments, or other configurations of the transmission lines is, of course, possible.

Figure 9A:
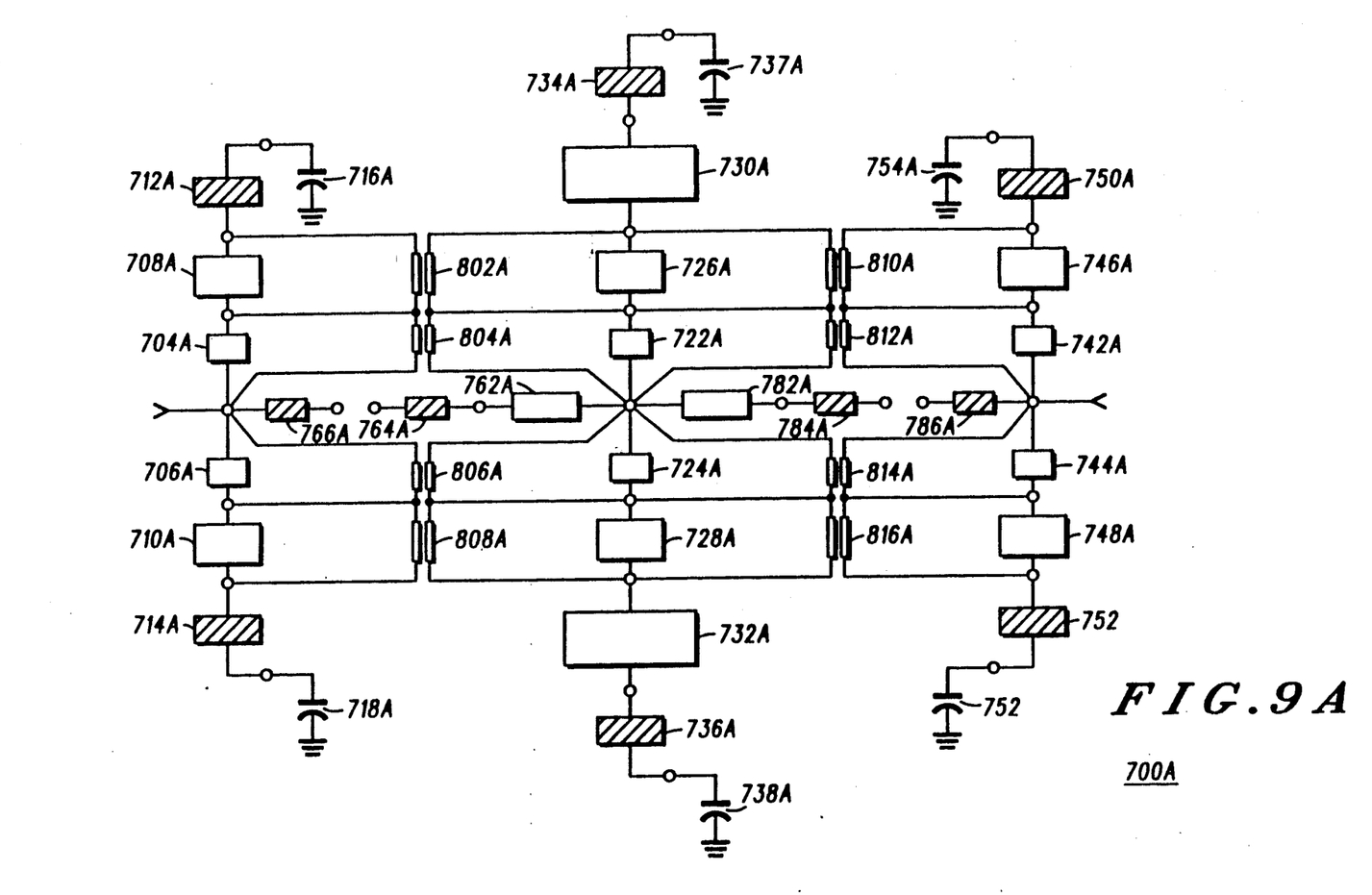
FIG. 9A is a model of the five-pole filter of FIG. 9.

Turning now to the block diagram of FIG. 9A, a model of circuit 700 of FIG. 9 is shown. The model of FIG. 9 is referred to generally by reference numeral 700A. Elements of circuit 700 are similarly numbered and represent similar structure. Accordingly, such structure will not be described in detail again. It is noted, however, that intercoupling between transmission line segments forming the distributed elements of adjacent ones of the capacitors of the five-pole filter comprising the circuit 700A is easily modelled, and such intercoupling is designated by model 700A of circuit 700.

More particularly, intercoupling between strip lines 708A and 726A is represented by element 802A; intercoupling between strip lines 704A and 722A is represented by element 804A; intercoupling between strip lines 706A and 724A is represented by element 806A; intercoupling between strip lines 710A and 728A is represented by element 808A.

Similarly, intercoupling between strip lines 726A and 746A is represented by element 810A; intercoupling between strip lines 722A and 742A is represented by element 812A; intercoupling between strip lines 724A and 744A is represented by element 814A; and intercoupling between strip lines 728A and 748A is represented by element 816A.

Because circuit 700 of FIG. 9 is accurately modeled by circuit 700A of FIG. 9, a low pass filter circuit of desired characteristics may be accurately designed.

Figure 10:
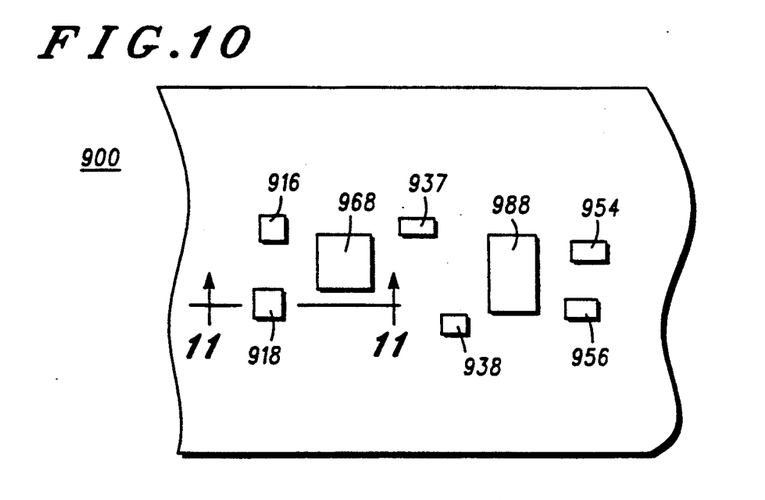
FIG. 10 is an enlarged, plan view of a portion of a circuit board upon which the filter of FIG. 9 may be disposed.

Turning now to the plan view of FIG. 10, a portion of a circuit board, referred to generally by reference numeral 900, upon which a filter circuit, such as circuit 700 of FIG. 8, is disposed is shown. As only the discrete capacitive and inductive components are disposed upon the surface of circuit board 900, only discrete capacitors 916, 918, 937, 938, 954, and 956, and discrete inductors 968 and 988 are shown. As the distributed elements comprise strip lines and are disposed beneath the surface of circuit board 900, such strip lines are not shown in the figure.

Figure 11:
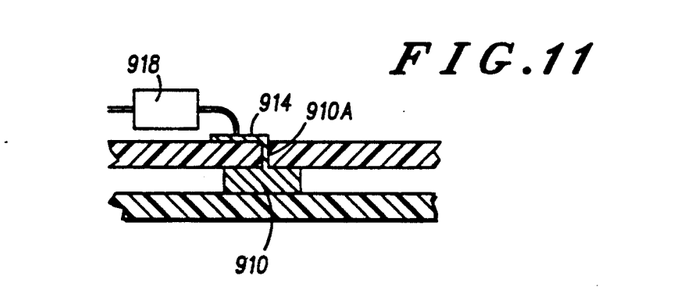
FIG. 11 is a cut away view of a portion of the circuit board shown in the plan view of FIG. 9.

FIG. 11 is a cut away view of a portion of circuit board 900 taken along line 11—11 of FIG. 10. The cut away view of FIG. 11 illustrates the connection between microstrip 914 forming a contact on a surface of circuit board 900 and strip line 910 disposed beneath the surface of circuit board 900. Via 910A interconnects microstrip 914 and strip line 910. Similar vias interconnect microstrips forming contacts and strip lines at other circuit locations of the circuit forming the filter circuit of the preferred embodiment of the present invention.

Figure 12:
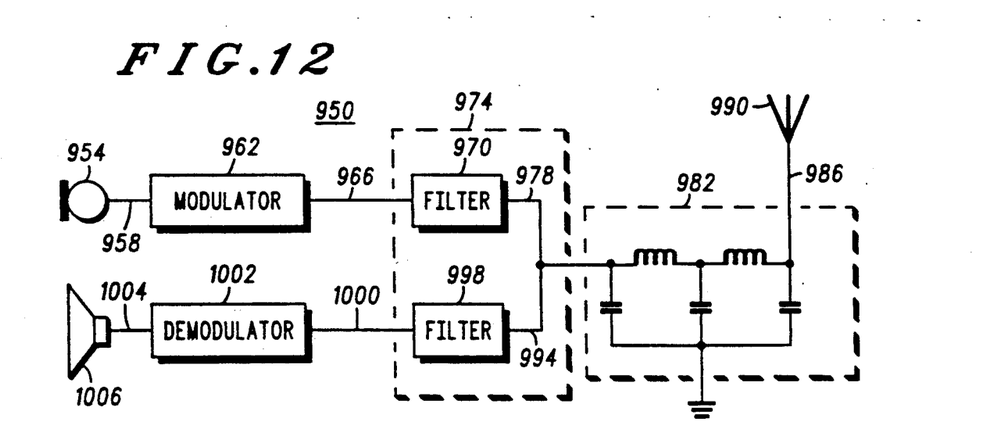
FIG. 12 is a block diagram of a radiotelephone in which the filter circuit of the preferred embodiment of the present invention forms a portion thereof.

Turning finally now to the block diagram of FIG. 12, a radiotelephone, referred to generally by reference numeral 950, which incorporates a filter circuit constructed according to the teachings of the present invention is shown. Radiotelephone 950 is comprised of both transmitter circuitry and receiver circuitry.

The transmitter circuitry of radiotelephone 950 is comprised of a transducer, such as microphone 954 which supplies a modulated signal on line 958 to modulator 962. Modulator 962 generates a modulated signal on line 966 which is supplied to a band pass filter 970 which preferably forms a portion of a duplexer 974. Filter 970 generates a signal on line 978 which is applied to filter 982 which preferably is of a construction corresponding to that of filter 700 of FIG. 8. Filter 982 forms a low pass filter which is operative to attenuate all but a desired portion of the signal applied thereto on line 978. Filter 982 generates a filtered signal on line 986 which is applied to antenna 990 whereat the filtered signal is transmitted therefrom.

The receiver circuitry of radiotelephone 950 receives a signal, after reception by antenna 990 and application to filter circuit 982, by way of line 986, a filtered signal on line 994 which is supplied to band pass filter 998. Filter 998 preferably comprises a portion of duplexer 974. Filter 998 generates a filtered signal on line 1000 which is supplied to demodulator 1002. Demodulator 1002 generates a demodulated signal on line 1004 which is applied to a transducer, such as speaker 1006.

Because the filter of the preferred embodiment of the present invention is of minimal physical dimensions while still adequately attenuating all but the desired spectral components of a signal applied thereto, the filter of the preferred embodiment of the present invention advantageously forms a portion of a radiotelephone.

While the present invention has been described in connection with the preferred embodiment shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. A circuit board-mounted filter circuit for attenuating selected frequency component portions of a signal applied thereto, said filter comprising:

an L-C circuit having at least one inductor and at least one capacitor, wherein said at least one inductor is formed of first and second portions, respectively, with the first portion of the at least one inductor being comprised of a discrete inductive component disposed upon the circuit board and with the second portion of the at least one inductor being comprised of a distributed inductive component formed of a stripline portion disposed within the circuit board and a microstrip portion disposed upon a surface of the circuit board; and wherein said at least one capacitor is formed of first and second portions, respectively, with the first portion of the at least one capacitor being comprised of a discrete capacitive component disposed upon the circuit board and with the second portion of the at least one capacitor being comprised of a distributed capacitive component formed of a stripline portion disposed within the circuit board and a microstrip portion disposed upon a surface of the circuit board.

2. The filter of claim 1 wherein said distributed inductive component of the at least one inductor further comprises a via for interconnecting the microstrip line portion and the stripline portion of the distributed inductive component.

3. The filter of claim 1 wherein the L-C circuit comprises at least two spaced-apart capacitors interconnected by an inductor, wherein intercoupling between the at least two spaced-apart capacitors is controlled by appropriate selection of the length of the distributed inductive component comprising the second portion of the inductor.

4. The filter of claim 1 wherein the stripline portion comprising the distributive capacitive component is comprised of at least two stripline segments of predetermined sizes.

5. The filter of claim 1 wherein said capacitive inductive component of the at least one capacitor further comprises a via for interconnecting the microstripline portion and the stripline portion of the distributed capacitive component.

6. The filter of claim 5 wherein a first side of the discrete capacitive component comprising the first portion of the at least one capacitor is electrically connected to the microstripline portion of the distributed capacitive component comprising the second portion of the at least one capacitor.

7. The filter of claim 6 wherein a second side of the discrete capacitive component comprising the first portion of the at least one capacitor is coupled to a ground potential.

8. The filter of claim 1 wherein the discrete inductive component comprising the first portion of the at least one inductor comprises a coiled-winding.

9. The filter of claim 1 wherein the discrete capacitive component comprising the first portion of the at least one capacitor comprises a parallel-plate capacitor wherein plates of the parallelplate capacitor are separated by a dielectric material.

10. The filter circuit of claim 1 wherein the L-C circuit comprises a multiple-pole, low pass filter wherein capacitors of the multiple-pole, low pass filter are spaced-apart from one another by inductors, and wherein lengths of the distributed inductive components comprising the second portions of the inductors are determinative of intercouplings between adjacent ones of the spaced-apart capacitors.

11. A circuit board-mounted, low pass filter circuit for attenuating high-frequency, spectral components of a signal applied thereto, said filter circuit comprising:

an L-C circuit having at least two capacitors spaced-apart from one another, with adjacent ones of the at least two spaced-apart capacitors being interconnected by an inductor, wherein each inductor interconnecting adjacent ones of the at least two spaced-apart capacitors is formed of first and second portions, respectively, with the first portions of each inductor being comprised of discrete inductive components disposed upon the circuit board, and with the second portions of each inductor being comprised of distributed inductive components each formed of stripline portions disposed within the circuit board and microstrip portions disposed upon a surface of the circuit board; and wherein each capacitor of said at least two capacitors is formed of first and second portions, respectively, with the first portions of each capacitor being comprised of discrete capacitive components and with the second portions of each capacitor being comprised of distributed capacitive components formed of stripline portions disposed within the circuit board and microstrip portions disposed upon a surface of the circuit board wherein lengths of the distributed inductive components formed of the stripline portions and the microstrip portions comprising the second portions of each of the inductors interconnecting the at least two capacitors are determinative of intercouplings between adjacent ones of the at least two spaced-apart capacitors.

12. A five-pole, low pass filter circuit mounted at a radio transceiver circuit board of a radio transceiver operative to transmit a radio frequency signal, said low filter for attenuating high-frequency harmonic components of the radio-frequency signal generated by the radio transceiver, said low pass filter comprising:

an L-C circuit having first, second, and third spaced-apart capacitors wherein adjacent ones of the spaced-apart capacitors are interconnected by inductors; wherein each of the spaced-apart capacitors are formed of first and second portions, respectively, with the first portions of each of the spaced-apart capacitors being comprised of discrete capacitive components, and with the second portions of each of the spaced-apart capacitors being comprised of distributed components formed of stripline portions disposed within the circuit board and microstrip portions disposed upon a surface of the circuit board; and wherein each inductor interconnecting the adjacent ones of the spaced-apart capacitors is formed of first and second portions, respectively, with the first portions of each inductor being comprised of discrete inductive components, and with the second portions of each inductor being comprised of distributed inductive components formed of stripline portions disposed within the circuit board and microstrip portions disposed upon a surface of the circuit board; and wherein lengths of the distributed inductive components formed of the stripline portions and the microstrip portions of the second portions of each of the inductors are determinative of intercouplings between adjacent ones of the spaced-apart capacitors.

13. In a radio transceiver having transmitter circuitry for generating a radio-frequency signal and receiver circuitry for receiving a radio-frequency signal, the combination with the transmitter circuitry of a low pass filter mounted at a circuit board for attenuating high frequency harmonics of the radio-frequency signal generated by the transmitter circuitry, said low pass filter comprising:

an L-C circuit having first, second, and third spaced-apart capacitors wherein adjacent ones of the spaced-apart capacitors are interconnected by inductors; wherein each of the spaced-apart capacitors are formed of first and second portions, respectively, with the first portions of each of the spaced-apart capacitors being comprised of discrete capacitive components, and with the second portions of each of the spaced-apart capacitors being comprised of distributed components formed of stripline portions disposed within the circuit board and microstrip portions disposed upon a surface of the circuit board; and wherein each inductor interconnecting the adjacent ones of the spaced-apart capacitors is formed of first and second portions, respectively, with the first portions of each inductor being comprised of discrete inductive components, and with the second portions of each inductor being comprised of distributed inductive components formed of stripline portions disposed within the circuit board and microstrip portions disposed upon a surface of the circuit board; and wherein lengths of the distributed inductive components formed of the stripline portions and the microstrip portions of the second portions of each of the inductors are determinative of intercouplings between adjacent ones of the spaced-apart capacitors.

* * * * *